United States Patent [19]

Trudel

[11] 4,305,760
[45] Dec. 15, 1981

[54] POLYSILICON-TO-SUBSTRATE CONTACT PROCESSING

[75] Inventor: Murray L. Trudel, Centerville, Ohio

[73] Assignee: NCR Corporation, Dayton, Ohio

[21] Appl. No.: 177,307

[22] Filed: Aug. 11, 1980

Related U.S. Application Data

[63] Continuation-in-part of Ser. No. 972,292, Dec. 22, 1978, abandoned.

[51] Int. Cl.³ .................... H01L 21/22; H01L 21/26; H01L 21/308; H01L 21/316
[52] U.S. Cl. .................... 148/1.5; 29/571; 29/576 B; 29/580; 148/187; 156/626; 156/657; 156/662; 427/95; 427/399
[58] Field of Search ............... 156/626, 653, 657, 662; 29/571, 578, 576 B; 148/1.5, 187; 427/95, 399

[56] References Cited

U.S. PATENT DOCUMENTS

| | | | |
|---|---|---|---|
| 3,523,842 | 8/1970 | Glendinning | 156/626 |
| 3,677,848 | 7/1972 | Stoller et al. | 156/626 |
| 3,936,331 | 2/1976 | Luce et al. | 156/657 |
| 3,950,188 | 4/1976 | Bower | 148/1.5 |
| 3,967,981 | 7/1976 | Yamazaki | 148/187 |
| 4,031,608 | 6/1977 | Togei et al. | 29/578 |
| 4,039,370 | 8/1977 | Kleinknecht | 156/626 |
| 4,080,718 | 3/1978 | Richman | 29/571 |
| 4,123,300 | 10/1978 | Joshi et al. | 148/187 |
| 4,127,931 | 12/1978 | Shiba | 29/578 |
| 4,139,402 | 2/1979 | Steinmaier | 156/657 |
| 4,148,931 | 4/1979 | Reuschel et al. | 427/95 |
| 4,151,631 | 5/1979 | Klein | 29/578 |
| 4,239,559 | 12/1980 | Ito | 29/578 |
| 4,263,709 | 4/1981 | Weitzel et al. | 29/571 |

Primary Examiner—Jerome W. Massie
Attorney, Agent, or Firm—J. T. Cavender; Philip A. Dalton

[57] ABSTRACT

A process for forming polysilicon-to-substrate contacts. The process permits the use of a polysilicon-to-substrate contact mask and eliminates the exposure of the substrate in the contact regions to the polysilicon etch. The polysilicon contact-forming conductors are formed from a layer of polysilicon by etching partially through the layer to leave a residual layer surrounding and defining the conductors; converting the residual polysilicon to oxide; and selectively etching the oxide. The result is a damage-free substrate contact region exhibiting reduced junction leakage current.

11 Claims, 10 Drawing Figures

POLYSILICON-TO-SUBSTRATE CONTACT PROCESSING

This application is a continuation-in-part of application Ser. No. 972,292, filed Dec. 22, 1978, now abandoned.

BACKGROUND OF THE INVENTION

The invention relates to microelectronics process techniques and, more particularly, to the formation of polysilicon-to-substrate contacts.

In conventional conductor-insulator-semi-conductor processing for forming polysilicon-to-substrate contacts, a layer of polysilicon is formed over the contact region of a monocrystalline silicon substrate and etched to shape, then the contact region is doped through the resulting polysilicon conductor. As a consequence of etching the polysilicon to define the conductor, the silicon substrate is unavoidably attacked by the etchant. The resulting damage to the substrate increases the leakage current of the junction formed in the polysilicon-to-substrate contact region.

FIG. 1 is a planar view, in schematic form, showing the relationship of the various masks used in conventional processing of polysilicon-to-silicon substrate contacts. The gate dielectric layer 8 is originally formed on substrate 9 within field oxide 10 (see FIG. 2) to correspond to mask window outline 11. A mask having window outline 12 is then formed over the gate dielectric layer 8 and the dielectric 8 is etched to form the contact opening 13 illustrated in the FIG. 2 cross-sectional view. A polysilicon layer is next deposited and etched using a mask having window outlines 14 and 15 to form conductor 16 and gate electrode 17. The conductor 16 terminates over and contacts the surface of region 18, which is this special case is the FET source or drain region. More generally, region 18 may be any substrate circuit component to which polysilicon contact is made.

In forming the polysilicon conductor 16, the surface of substrate region 18 is etched by the polysilicon (polycrystalline silicon) etchant once the polysilicon surrounding the conductor is removed. The polysilicon etchant causes pitting and cracking of the surface of region 18. In subsequent processing, the substrate region 18 is doped with an impurity such as phosphorus. The polysilicon conductor is in place during the diffusion process so that, by diffusing through the conductor, ohmic contact is made between the conductor 16 and the diffused region 18. However, the leakage current at the junction of the polysilicon and the substrate is higher than that for an equivalent metal-to-substrate contact. The increased leakage current results from the damage incurred in the contact region during the polysilicon etching step, especially that at the boundary 19 between the polysilicon and the substrate region 18.

The increased leakage current occurs in both p-type and n-type contacts. Minimizing the junction leakage current is especially important whenever a precharged junction region must be held at a given potential for a set period of time. This situation is characteristic of dynamic circuits, but can also occur during the operation of static circuits.

SUMMARY OF THE INVENTION

The invention is a process for forming polysilicon-to-substrate contacts without subjecting the substrate contact region to polysilicon etchant. The process comprises masking the contact-forming polysilicon layer to define the contact(s); etching partially through the masked polysilicon layer to leave a residual thickness of polysilicon surrounding the contact(s); oxidizing the residual polysilicon; and selectively etching the oxidized residual polysilicon with an etchant which does not attack the substrate upon completion of the polysilicon oxide etch. Ohmic contact is then established between the resulting polysilicon conductor and the underlying substrate by doping through the conductor.

DETAILED DESCRIPTION

Figure 1:
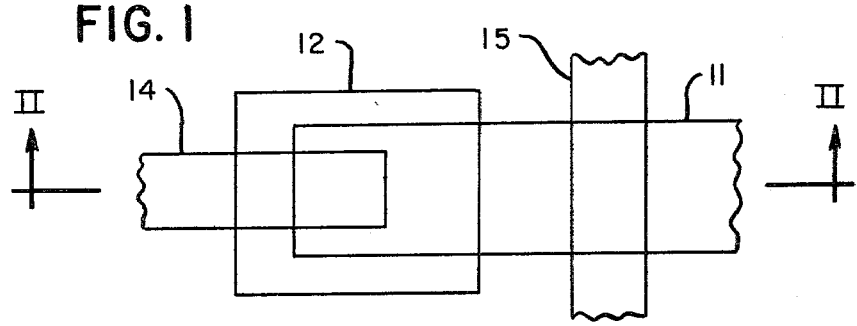
FIG. 1 is a plan view in schematic form showing the relationship of the masks used in conventional processing to form an FET gate structure and a polysilicon conductor which contacts the source or drain of the FET.
Figure 2:
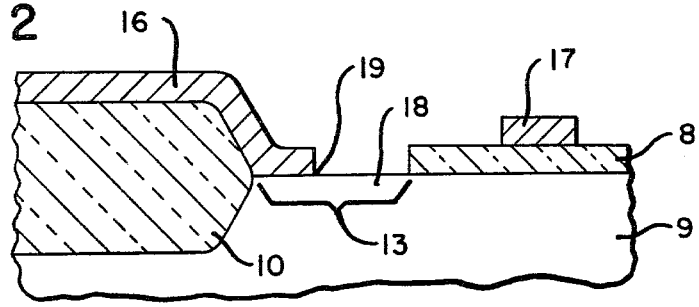
FIG. 2 is a cross-sectional view of the partially-completed FET formed using the masks shown in FIG. 1, viewed in the direction of the arrows 2—2 in FIG. 1.
Figure 3:
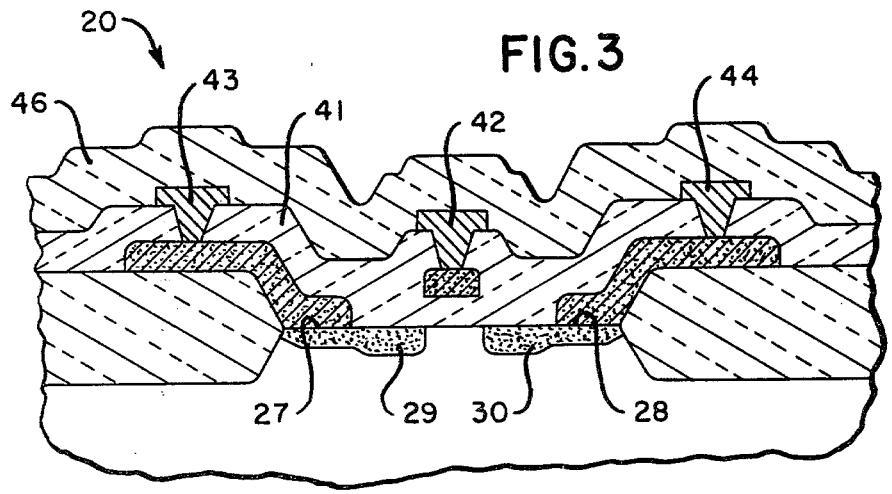
FIG. 3 is a cross-sectional view of an FET having polysilicon-to-substrate contacts formed using the process of the present invention.

Referring to FIG. 3, consider as an example of the invention, a process for forming an n-channel silicon gate FET 20 which has a single-layer silicon dioxide gate dielectric. The particular FET and process are used by way of example only, for the invention is applicable in general to the forming of any polysilicon-to-substrate contact.

Figure 4:
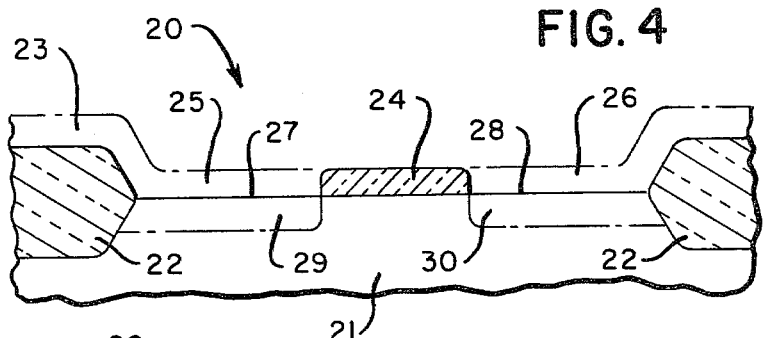
FIGS. 4-10 are cross-sectional views, in the manner of FIG. 3, illustrating various stages of the processing of the FET of FIG. 3.

Referring to FIG. 4, after forming field oxide 22 and gate oxide layer 23 on monocrystalline silicon substrate 21, standard photolithographic and oxide etch techniques are used to form the gate oxide 24. The oxide etch also opens windows or openings 25 and 26 to the source and drain surface contact regions 27 and 28 over the as-yet unformed source 29 and drain 30.

Figure 5:
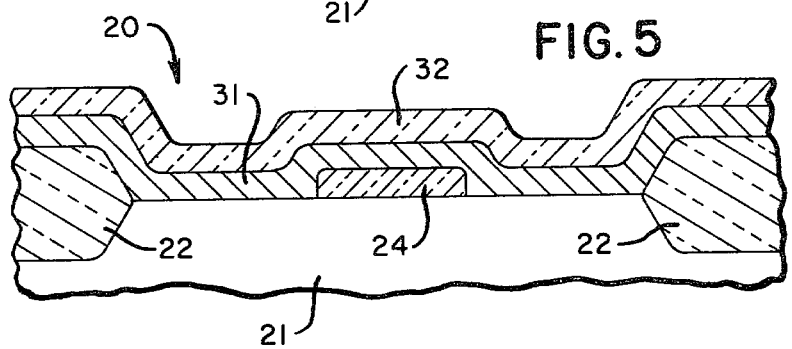

Next, as shown in FIG. 5, a polysilicon layer 31 is formed over the partially-completed wafer 20. Then, the polysilicon conductors are formed without damaging the substrate contact regions 27 and 28 by: forming a polysilicon-etch-resistant mask (i.e., a mask which is resistant to etching by the medium used for etching the polysilicon) on the polysilicon layer to define the conductors; etching a separate polysilicon monitor wafer to determine the time, $t_c$, required to etch through the polysilicon to the silicon substrate surface; etching the masked device wafer a lesser time than $t_c$ to leave a thin polysilicon residual surrounding and defining the conductors; oxidizing the residual polysilicon; and selectively etching the oxidized residual to remove the residual without damaging the underlying silicon substrate regions. (The use of "silicon substrate" and "monocrystalline silicon substrate" is by way of example only, for the invention applies in general to forming contacts between silicon bodies, whether substrate or not and whether polycrystalline or monocrystalline.)

Those skilled in the art will understand that the particular contact arrangement in FIGS. 3-10 is shown merely to facilitate description and is representative of various contacts between a silicon conductor and a doped region of a semiconductor substrate. For example, contact to FET source and drain substrate regions is usually made at a single point along each of a pair of doped impurity "stripes" which comprise both the source and the drain for a plurality of devices and also the interconnections therebetween. It will be appreciated that the contact regions 27 and 28 to source and drain 29 and 30 represent contacts (1) to active devices, such as source and drain regions, (2) to passive devices such as resistors, and (3) to the interconnections between circuit components.

The steps of the exemplary process are summarized in the TABLE below.

TABLE

| FIG. | Process Step | Description |
|---|---|---|
| 4 | 1 | Form polysilicon-to-silicon substrate contact windows in partially-completed wafer: |
|  | 1.1 | Delineate etch mask (not shown) |
|  | 1.2 | Etch contact windows 25, 26 in oxide |
|  | 1.3 | Strip mask |
| 5 | 2 | Deposit polysilicon layer 31 |
| 5 | 3 | Form masking oxide layer 32 |
| 6 | 4 | Mask polysilicon: |
|  | 4.1 | Delineate photoresist mask 33 |
|  | 4.2 | Etch oxide to form mask 34 |
|  | 4.3 | Strip photoresist mask 33 |
| 7-9 | 5 | Form polysilicon conductor(s): |
|  | 5.1 | Etch monitor polysilicon layer |
| 7 | 5.2 | Partially etch polysilicon 31 to define conductors 37, 38 and gate electrode 39 bounded by residual 36 |
| 8 | 5.3 | Oxidize residual polysilicon |
| 9 | 5.4 | Remove (etch) oxidized residual |
| 10 | 6 | Form polysilicon-to-substrate contacts: |
|  | 6.1 | Deposit dopant, e.g. by diffusion or implantation (step 6.1), and |
|  | 6.2 | drive-in dopant in all exposed polysilicon and gate conductor regions (e.g. 37, 38, 39), in contact regions 27, 28, and in selected substrate regions (e.g. source and drain 29, 30) (step 6.2) |
| 3 | 7 | Complete wafer processing: |
|  | 7.1 | Form insulator 41 |
|  | 7.2 | Open contact windows |
|  | 7.3 | Metallization |
|  | 7.4 | Form passivation coating 46 |

To follow the process in detail, start with the partially-completed wafer 20 of FIG. 4 which comprises field oxide 22 and gate oxide layer 23 (typically 500-1000 Angstroms (0.05-0.1 microns) thick) formed on substrate 21. First, the contact windows 25 and 26 are formed over the surface contact regions 27 and 28 of the substrate (step 1). Standard photolithographic techniques are used to form an etch-resistant photoresist mask (not shown) to protect the gate oxide 24 (step 1.1), then the gate oxide over the regions 27 and 28 is etched away to provide the windows 25, 26 (step 1.2), and the photoresist mask is removed (step 1.3). The oxide etch step may use any suitable oxide etchant such as buffered hydrofluoric acid, which is a mixture of hydrofluoric acid and ammonium fluoride.

Next, and referring to FIG. 5, polysilicon layer 31 is formed (step 2) using a process such as low pressure chemical vapor deposition (LPCVD) which provides a uniform, reproducible polysilicon thickness. Suitable LPCVD processes include the pyrolysis of dichlorosilane, $SiCl_2H_2$, or preferably of silane, $SiH_4$, at about 600° C. to 700° C. The polysilicon layer must be of sufficient thickness to avoid very high resistivity, without being so thick that the contact diffusion is blocked (durng step 6) or that large steps in the metallization (formed in step 7.3) present discontinuity problems. A suitable thickness for many applications is about 5,000 Angstroms (0.5 microns).

Referring further to FIG. 5, masking oxide layer 32 is now formed using thermal oxidation, chemical vapor deposition, etc. (step 3). One suitable thermal oxidation process, termed wet oxidation, involves bubbling oxygen through heated water and then through a film growth zone which is maintained at about 900° C. and contains the wafer 20. The thickness of the oxide layer 32 is not critical; 1,000 Angstroms (0.1 micron) is typical.

Figure 6:
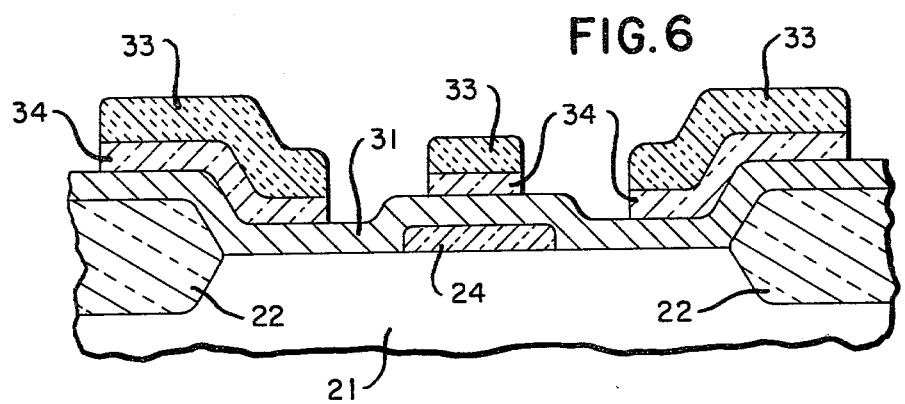

Referring to FIG. 6, next the oxide layer 32 is formed into a mask 34 (step 4) for use in etching the polysilicon layer 31. First, standard photolithographic techniques are used to form photoresist mask 33 on the masking oxide layer 32 (step 4.1). Then, a conventional oxide etchant such as buffered hydrofluoric acid is applied to oxide layer 32 in the presence of the photoresist mask to develop the mask 34 (step 4.2). Finally, the photoresist mask 33 is stripped, for example, in a suitable solvent (step 4.3).

As a first sub-step in forming the polysilicon conductors pursuant to step 5, a layer of polysilicon on a separate monitor wafer (not shown) is etched to determine the time required to completely remove the polysilicon monitor layer (step 5.1). This monitor layer has the same thickness as layer 31 and is best formed at the same time as, and in the same deposition chamber used for, layer 31. Then, a reproducible etch process is applied and the time, $t_c$, required to etch through the polysilicon monitor layer is determined. Since polysilicon can be distinguished from films such as oxide films by color and reflectance, it is convenient to form the polysilicon monitor layer on a non-silicon film, such as an oxide film, nitride film, etc. grown on a silicon substrate and calculate $t_c$ as the time interval between the start of etching and the onset of the distinguishing color and/or reflectance changes. The polysilicon etchant can be, e.g., a 30:1:15 mixture by volume of nitric, hydrofluoric and acetic acids, which etches a 5,000 Angstrom polysilicon layer in $t_c \simeq 60$ seconds. This etch and ratios are given as examples only, for other ratios and other etchants will work equally well.

Figure 7:
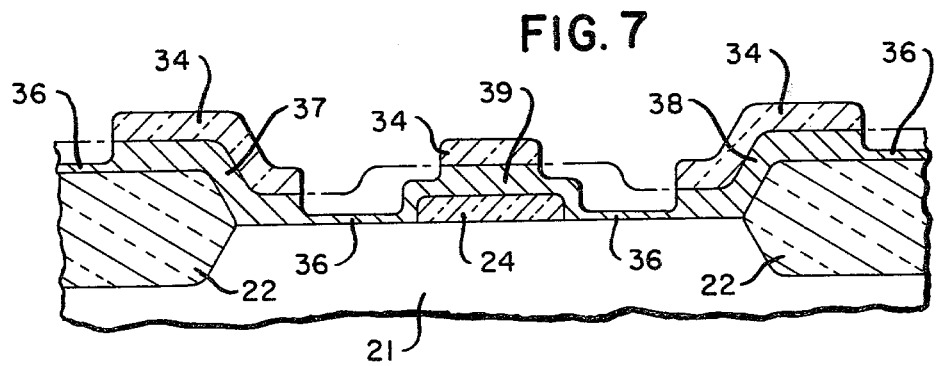

Preferably, the same etch parameters (etchant and temperature) are then used, but for a shorter time than $t_c$, to partially etch the polysilicon layer 31 as shown in FIG. 7 (step 5.2). The shorter etch leaves a residual 36 of polysilicon which borders and defines the conductors 37 and 38 and the gate electrode 39. The thickness of the residual polysilicon is not critical. Using the 30:1:15 nitric acid:hydrofluoric acid:acetic acid etchant, an etch time of about $(t_c-5)$ seconds leaves a residual of 300-500 Angstroms (0.03-0.05 microns).

The masking oxide layer 34 can be removed now, prior to oxidizing the residual polysilicon, by etching in buffered hydrofluoric acid. Alternatively, the oxide 34 can be removed along with the oxidized residual in step 5.4.

Figure 8:
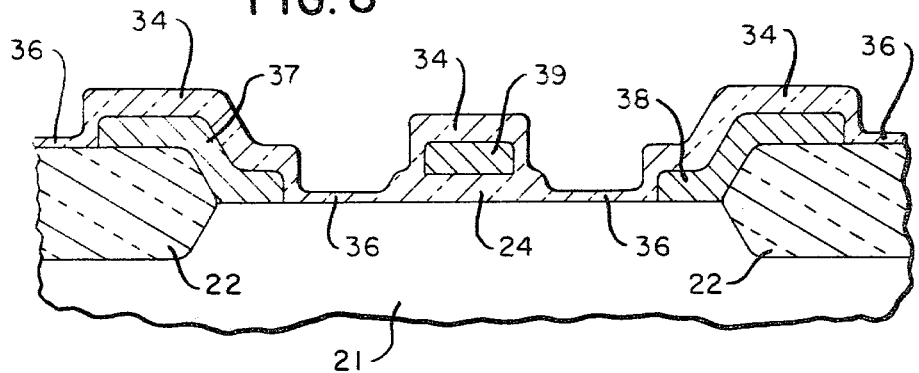

Referring to FIG. 8, the residual polysilicon 36 is now completely thermally oxidized (step 5.3), using a thermal oxidation process such as wet oxidation at 900° C.

Figure 9:
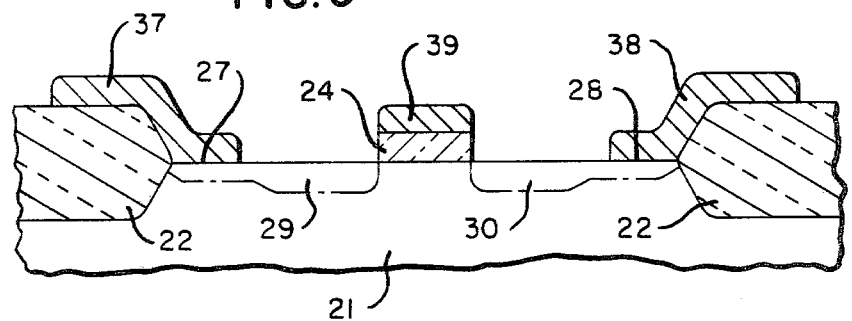

Referring to FIG. 9, the polysilicon oxide formed from the residual 36 (and, possibly, the masking oxide layer 34) is completely removed by etching, for example, in a buffered hydrofluoric acid bath (step 5.4). As it does not attack monocrystalline or polycrystalline silicon, this etchant will not attack the substrate silicon 21 upon completion of the etching of the oxide films. The etch time here must include the necessary time to also etch the exposed gate oxide regions 24 beneath the oxidized residual polysilicon 36 on both sides of the polysilicon gate electrode 39, in order to permit proper doping of the source and drain in step 6. Buffered hydrofluoric acid will remove the oxidized residual polysilicon (and the thicker masking oxide layer 34, if not removed in step 5.2) in about 30 to 60 seconds, and the exposed, 500–1000 Angstrom thick gate oxide regions 24 in an additional 30 to 60 seconds when the bath temperature is about 32° C. The total etch time is thus about one to two minutes.

The resulting FIG. 9 structure comprises polysilicon conductors 37 and 38 which contact the source and drain regions 29 and 30 at surface regions 27 and 28, and polysilicon gate electrode 39, which was formed over the gate oxide 24 during the process of forming the conductors.

Figure 10:
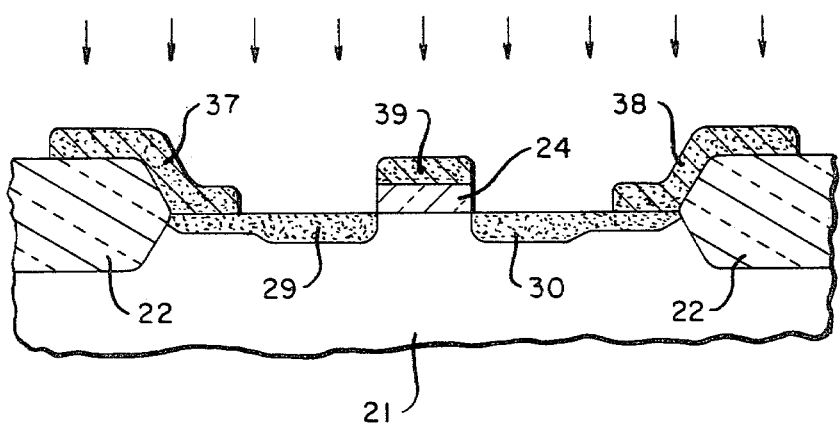

Referring now to FIG. 10, in step 6 an impurity doping technique is used to adjust the semi-conductor impurity level is selected substrate regions such as the source and drain regions 29 and 30; in exposed polysilicon conductors 37, 38 and the gate electrode 39; and, by diffusion through the polysilicon conductors, in the contact regions 27 and 28 to form polysilicon-to-substrate ohmic contacts. Typically, the impurity doping is accomplished by depositing the impurities (step 6.1), then further driving-in the impurities by diffusion, as required (step 6.2). In case deposition can be continued during drive-in, both deposition and drive-in can be accomplished in a single process step. Alternatively, ion implantation can be used for depositing the semiconductor dopant.

For the p-type wafer 21, impurity doping can be accomplished by diffusion of phosphorus, using POCl$_3$ as the phosphorus source and a deposition temperature of about 900° C. (step 6.1), and a drive-in temperature also of about 900° C. (step 6.2). Alternatively, as mentioned, the phosphorus can be deposited using ion implantation, perhaps with an anneal step to remove any structural damage and to activate the implanted species. The drive-in of either diffusion-deposited or implantation-deposited species (step 6.2) can be accomplished by other high temperature process steps that occur after deposition. In this case, the separate drive-in, or the drive-in portion of the combined deposition-drive-in, may be shortened or eliminated.

The wafer 21 is completed to the exemplary structure shown in FIG. 3 by forming an oxide insulating layer 41 (step 7.1); forming contact windows in the oxide insulator layer 41 (step 7.2); forming metal conductors such as gate contact 42 and source and drain contacts 43 and 44 (step 7.3); and forming a passivation coating 46 over the wafer (step 7.4).

The insulator layer 41 (step 7.1) can be formed by CVD oxide deposition, using silane and oxygen reactants and a deposition temperature of about 400° C. to form an undoped insulator layer, or by adding phosphine (PH$_3$) to the silane and oxygen to form a phosphosilicate glass layer (PSG). In some cases it may be convenient to first form an undoped oxide layer followed by a PSG layer. Typical total thicknesses for the layer(s) 41 are 5,000–10,000 A° (0.5–1.0 micron).

To form the oxide contact windows (step 7.2) standard photolithographic techniques are used to form an etch-resistant mask which exposes the window areas of the oxide 41, then the oxide is etched using, e.g. buffered hydrofluoric acid.

A typical metallization process (step 7.3) involves the deposition of aluminum, aluminum-silicon, or other conductive metal, followed by masking and etching steps to form the desired conductor pattern, which includes source and drain contacts 43 and 44 and gate contact 42.

Finally, the passivation coating 46 (step 7.4) can be formed using the oxide CVD process described in step 7.1. PSG is a preferred oxide passivation layer 46.

Junctions in polysilicon-silicon contact regions prepared using the above described process of this invention will exhibit less etch damage and therefore lower leakage currents than occur in otherwise equivalent contact regions in which the polysilicon contact material is etched directly to the semiconductor substrate.

Thus, there has been described a process for forming polysilicon-to-substrate contacts which substantially decreases the resulting leakage current of the junctions formed in such contact regions, and specific examples of parameters for applying the process.

I claim:

1. A process for forming at least a contact between a doped region of a silicon substrate and a layer of polysilicon formed on the substrate, comprising:
   forming a polysilicon-etch-resistant mask on the polysilicon layer and exposing a selected portion of the layer to define a conductor pattern;
   etching partially through the selected portion;
   oxidizing the residual polysilicon;
   etching the oxidized residual polysilicon to remove the oxidized residual polysilicon without etching the silicon substrate; and
   doping the contact region formed between the polysilicon conductor and the semiconductor substrate.

2. The process of claim 1 wherein the polysilicon conductor has an outer surface on the side thereof opposite the contact region and wherein the contact region is doped by exposing the conductor outer surface to dopant provided by one of diffusion or ion implantation to deposit the dopant in the exposed surface and driving-in the dopant to the contact region.

3. The process of claim 1 wherein the polysilicon layer is formed on the substrate using chemical vapor deposition to provide a layer of predetermined, precisely controlled thickness, further comprising:
   forming a separate monitor layer of polysilicon of the predetermined thickness on a non-silicon base by chemical vapor deposition;
   determining the time, $t_c$, required to completely etch through the polysilicon monitor layer; and wherein the process of etching the polysilicon layer comprises parameters duplicating those used in etching the polysilicon monitor layer except that etching is for a time sufficiently less than $t_c$ to provide a polysilicon residual of the desired thickness.

4. The process of claim 1 or 3 wherein the polysilicon layer is formed by the pyrolysis of silane at approximately 600° C. to 700° C.

5. The process of claim 1 or 3 wherein the polysilicon layer is formed by the pyrolysis of silane to a thickness of about 5,000 Angstroms.

6. The process of claim 3 wherein:

the monitor layer of polysilicon is formed on a non-silicon layer; and $t_c$ is determined by etching the polysilicon monitor layer to completely remove the monitor layer and measuring the time required for removal as determined by the change of color or reflectance properties from those characteristic of polysilicon to those characteristic of the non-silicon layer.

7. In a process for forming an integrated circuit comprising a silicon substrate having impurity regions forming active and passive components and interconnections therein, wherein contacts are formed connecting selected regions of the substrate to polysilicon conductors terminating at the selected regions, the improvement comprising:

forming (1) a layer of polysilicon on the silicon substrate and (2) a separate monitor layer of polysilicon of the same thickness as the polysilicon layer on a non-silicon layer;

determining the time, $t_c$, required to etch through the polysilicon monitor layer;

etching the polysilicon layer in the presence of a polysilicon-etch-resistant mask formed on the polysilicon defining a conductor pattern therein, and for a time sufficiently less than $t_c$ to form the polysilicon conductors bounded by a residual thickness of the polysilicon layer;

converting the residual polysilicon to silicon oxide;

removing the oxidized residual polysilicon by applying an etchant that selectively etches silicon oxide; and forming ohmic contact between the conductors and the underlying impurity regions of the substrate by doping through the polysilicon conductors.

8. The process of claim 7 wherein the polysilicon layer and polysilicon monitor layer are formed by the pyrolysis of silane at approximately 600° C. to 700° C.

9. The process of claim 7 or 8 wherein hydrofluoric acid is used to selectively etch the oxidized polysilicon.

10. An improved process for forming at least a contact between a silicon substrate and a layer of polysilicon formed on the substrate, the improvement comprising:

forming a polysilicon-etch-resistant mask on the polysilicon layer and exposing a selected portion of the layer to define a conductor pattern;

etching partially through the selected portion;

oxidizing the residual polysilicon; and removing the oxidized residual polysilicon using a selective etchant that etches the oxidized residual polysilicon and not silicon.

11. The process of claim 10 wherein buffered hydrofluoric acid is the etchant for the oxidized polysilicon.

* * * * *